United States Patent
Saitoh et al.

(10) Patent No.: US 10,580,849 B2
(45) Date of Patent: Mar. 3, 2020

(54) DISPLAY DEVICE INCLUDING AN INORGANIC RESIDUAL LAYER DEFINED IN AN OPENING OF A BENDING SECTION

(71) Applicant: Sharp Kabushiki Kaisha, Sakai, Osaka (JP)

(72) Inventors: Takao Saitoh, Sakai (JP); Yohsuke Kanzaki, Sakai (JP); Seiji Kaneko, Sakai (JP); Masahiko Miwa, Sakai (JP); Masaki Yamanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/462,286

(22) PCT Filed: Aug. 3, 2017

(86) PCT No.: PCT/JP2017/028245
§ 371 (c)(1),
(2) Date: May 20, 2019

(87) PCT Pub. No.: WO2019/026237
PCT Pub. Date: Feb. 7, 2019

(65) Prior Publication Data
US 2019/0355800 A1   Nov. 21, 2019

(51) Int. Cl.
*H01L 27/32* (2006.01)
*H01L 51/00* (2006.01)

(52) U.S. Cl.
CPC ...... *H01L 27/3276* (2013.01); *H01L 27/3288* (2013.01); *H01L 27/3297* (2013.01); *H01L 51/0097* (2013.01); *H01L 27/3258* (2013.01)

(58) Field of Classification Search
CPC ............ H01L 27/3276; H01L 27/3258; H01L 27/3288; H01L 27/3297; H01L 51/0097
See application file for complete search history.

(56) References Cited

U.S. PATENT DOCUMENTS

| | | | |
|---|---|---|---|
| 2014/0138637 A1 | 5/2014 | Yang et al. | |
| 2014/0353670 A1 | 12/2014 | Youn et al. | |
| 2016/0174304 A1 | 6/2016 | Kim et al. | |
| 2017/0092230 A1 | 3/2017 | Kuwabara | |
| 2017/0170206 A1 | 6/2017 | Lee et al. | |
| 2017/0194404 A1 | 7/2017 | Park et al. | |
| 2017/0262109 A1* | 9/2017 | Choi | ...... G06F 3/0412 |
| 2018/0145125 A1* | 5/2018 | Lee | ...... H01L 27/3262 |
| 2019/0019441 A1* | 1/2019 | Shin | ...... H01L 51/0031 |

FOREIGN PATENT DOCUMENTS

| | | |
|---|---|---|
| JP | 2014-232300 A | 12/2014 |
| JP | 2016-503515 A | 2/2016 |
| JP | 2017-111435 A | 6/2017 |
| JP | 2017-120775 A | 7/2017 |

OTHER PUBLICATIONS

Official Communication issued in International Patent Application No. PCT/JP2017/028245, dated Oct. 24, 2017.

\* cited by examiner

*Primary Examiner* — Michael Jung
(74) *Attorney, Agent, or Firm* — Keating & Bennett, LLP

(57) ABSTRACT

At a bending section of a frame region, an opening portion is formed on at least one layer of inorganic film included in a TFT layer, in which a residual layer of the inorganic film is formed, a flattening film is provided to plug the opening portion, and the frame wiring line is provided on the flattening film.

20 Claims, 6 Drawing Sheets

DISPLAY DEVICE INCLUDING AN INORGANIC RESIDUAL LAYER DEFINED IN AN OPENING OF A BENDING SECTION

TECHNICAL FIELD

The disclosure relates to a display device.

BACKGROUND ART

In recent years, organic EL display devices, which use organic electroluminescence (EL) elements and are of the self-luminous type, have attracted attention as a display device that can replace liquid crystal display devices. As the organic EL display device, an organic EL display device having flexibility, in which an organic EL element or the like is formed on a flexible resin substrate has been proposed. In the organic EL display device, there is a rectangular display region for displaying an image and a frame region formed around the display region, where reduction of the frame region is demanded. In the organic EL display device having flexibility, for example, if the frame region is reduced by bending the frame region located on the terminal side, the wiring line arranged in the frame region may be broken.

For example, PTL 1 discloses a flexible display device that forms a bending hole, thus removing a part of each of a buffer film, a gate insulating film, and an interlayer insulating film each corresponding to the bending region, and thus preventing disconnection of the wiring line.

CITATION LIST

Patent Literature

PTL 1: JP 2014-232300 A

SUMMARY

Technical Problem

Incidentally, a flexible organic EL display device is provided with an inorganic film such as a base coat film, a gate insulating film, or an interlayer insulating film on the resin substrate, thus, a flattening film may occasionally be formed on the portion where the inorganic film at a bending section of a frame region has been removed, and wiring lines are formed on the flattening film, to thus suppress breaking of the wiring lines arranged in the frame region. Here, a dry etching is used to remove the inorganic film at the bending section of the frame region, then, the dry etching removes together the surface layer of the resin substrate. This may lower the adhesion between the resin substrate and the flattening film.

The disclosure has been made in view of the above, and an object of the disclosure is to enhance the adhesion between the resin substrate and the flattening film at the bending section of the frame region.

Solution to Problem

In order to achieve the above object, a display device according to the disclosure includes a resin substrate, a light-emitting element included in a display region, the light-emitting element being provided above the resin substrate with a TFT layer in between, a frame region provided around the display region, a terminal section provided at an end portion of the frame region, a bending section provided between the display region and the terminal section, a frame wiring line provided in the frame region, the frame wiring line extending to the terminal section with being coupled to the light-emitting element, and an at least one layer of inorganic film provided in the frame region, the at least one layer of inorganic film being included in the TFT layer overlaid on the resin substrate, wherein at the bending section, an opening portion is formed on the at least one layer of inorganic film, in the opening portion, a residual layer of the inorganic film is formed, and the frame wiring line is provided on a flattening film being provided to plug the opening portion.

Advantageous Effects of Disclosure

According to the disclosure, at the bending section of the frame region, an opening portion is formed on at least one layer of inorganic film included in a TFT layer, where in the opening portion, a residual layer of the inorganic film is formed, and the frame wiring line is provided on a flattening film being provided to plug the opening portion, thus enhancing the adhesion between the resin substrate and the flattening film at the bending section of the frame region.

BRIEF DESCRIPTION OF DRAWINGS

FIG. 10 is a view corresponding to FIG. 5.

FIG. 11 is a view corresponding to FIG. 5.

FIG. 12 is a view corresponding to FIG. 6.

DESCRIPTION OF EMBODIMENTS

Embodiments of the disclosure will be described below in detail with reference to the drawings. The disclosure is not limited to the embodiments described below.

First Embodiment

Figure 1:
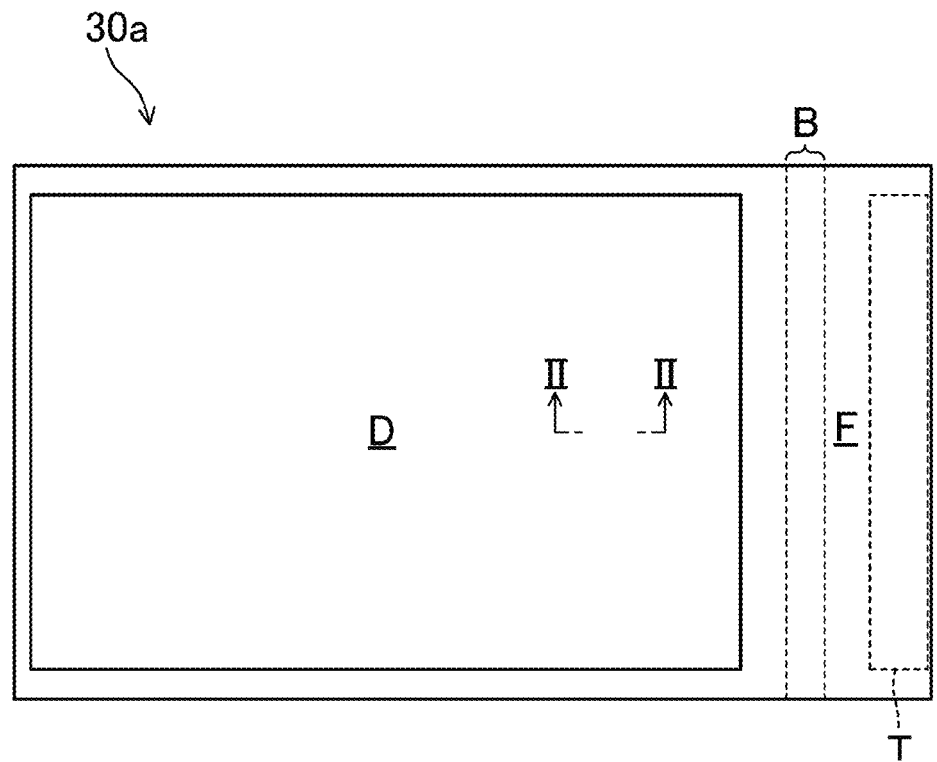
FIG. 1 is a plan view of an organic EL display device according to a first embodiment of the disclosure.
Figure 2:
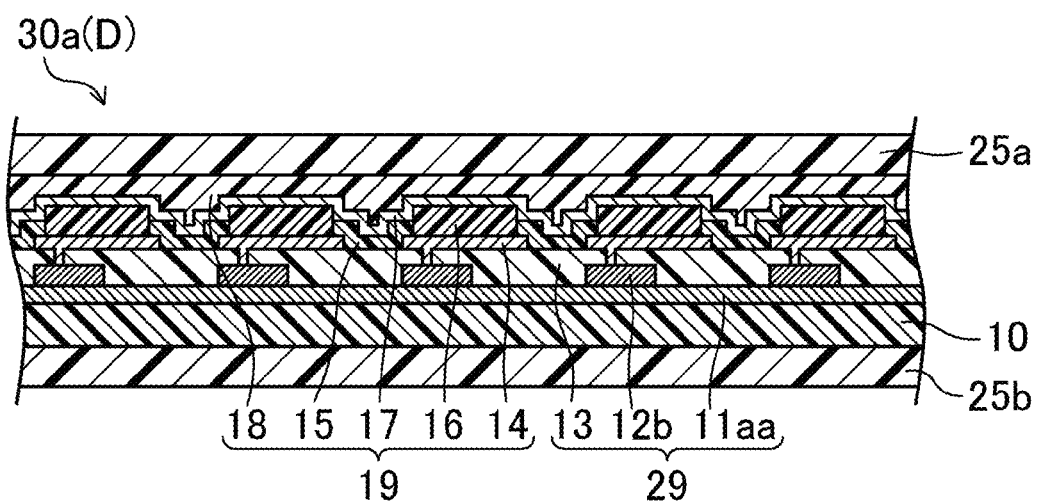
FIG. 2 is a cross-sectional view of the organic EL display device taken along line II-II in FIG. 1.
Figure 3:
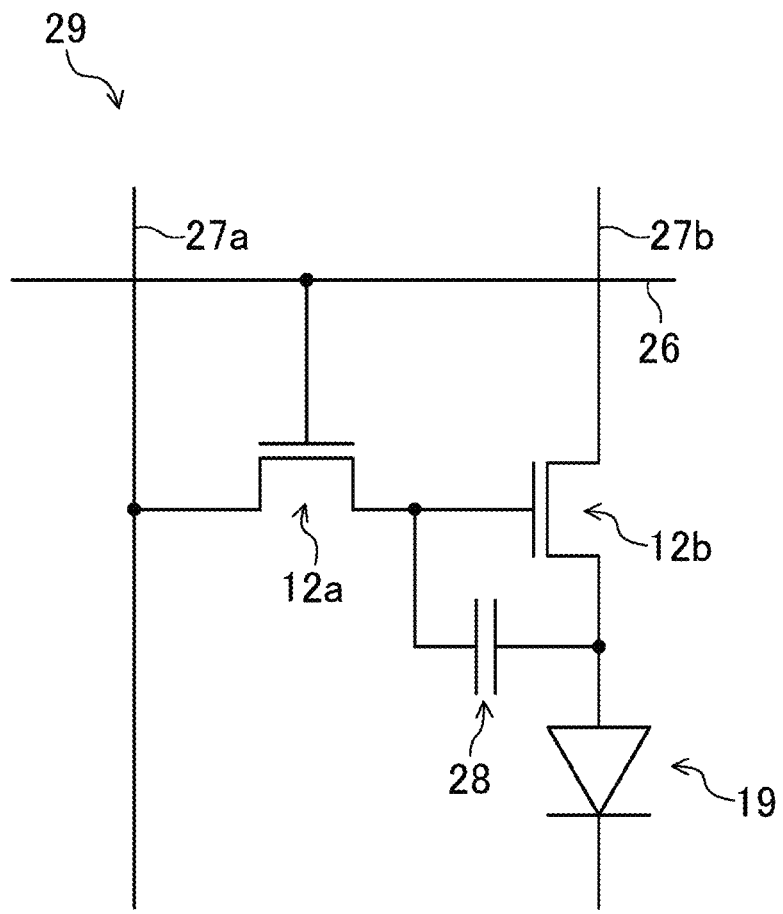
FIG. 3 is an equivalent circuit diagram of a TFT layer included in the organic EL display device according to the first embodiment of the disclosure.
Figure 4:
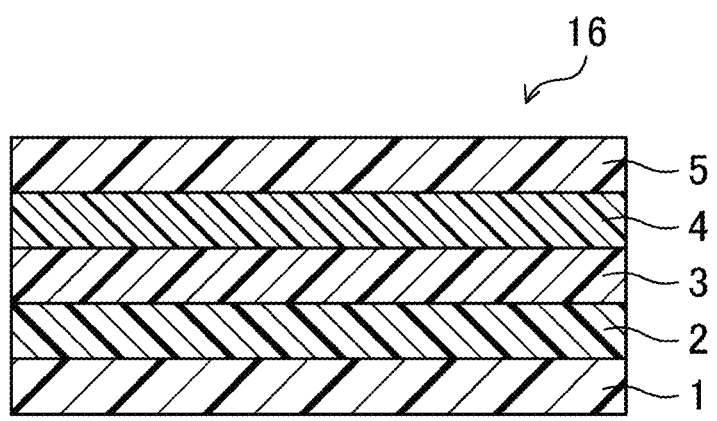
FIG. 4 is a cross-sectional view of an organic EL layer included in the organic EL display device according to the first embodiment of the disclosure.
Figure 5:
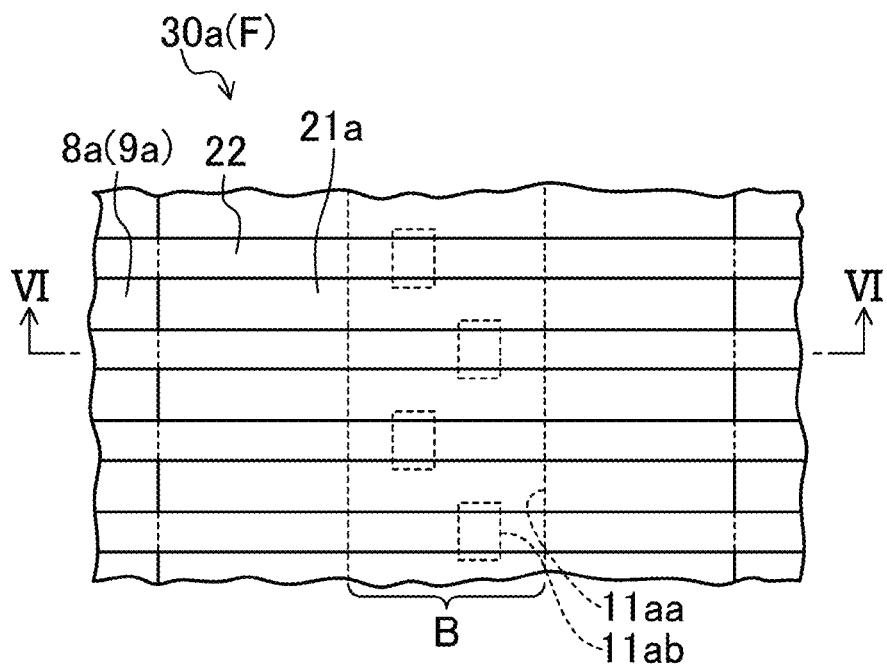
FIG. 5 is a plan view illustrating a bending section of a frame region of the organic EL display device according to the first embodiment of the disclosure.
Figure 6:
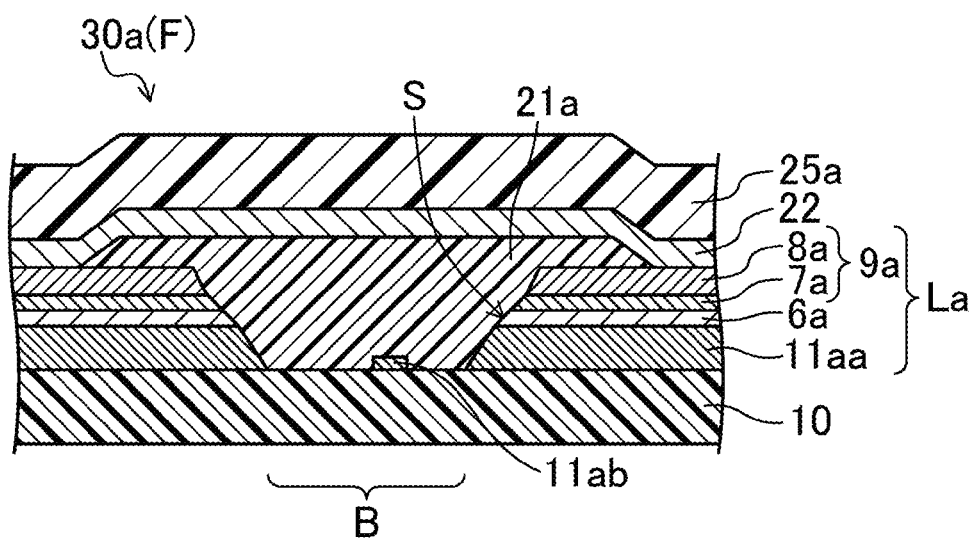
FIG. 6 is a cross-sectional view of a bending section of a frame region of the organic EL display device taken along the line VI-VI in FIG. 5.
Figure 7:
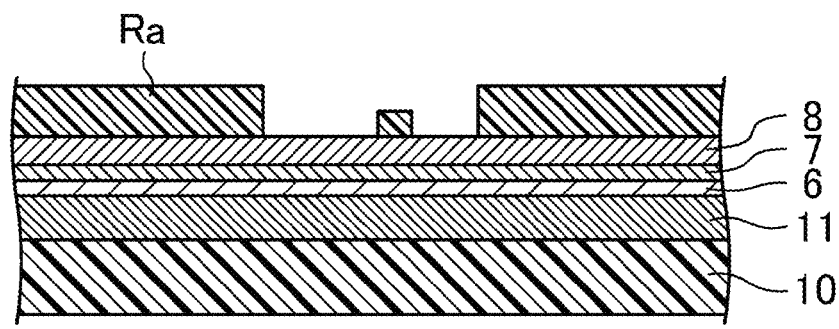
FIG. 7 is a cross-sectional view illustrating the first step for forming a residual layer of an inorganic film included in the organic EL display device according to the first embodiment of the disclosure.
Figure 8:
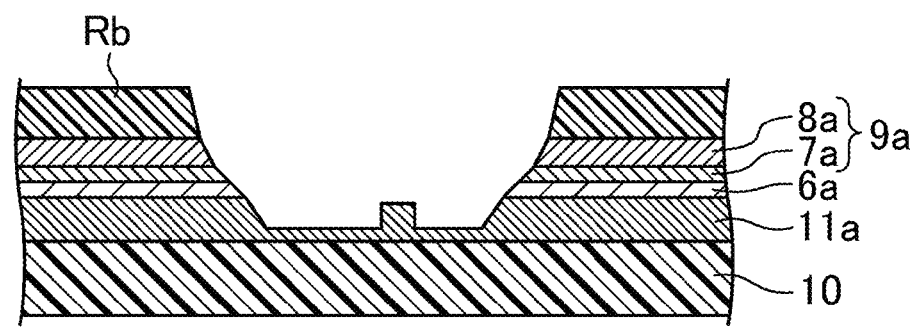
FIG. 8 is a cross-sectional view illustrating the second step for forming a residual layer of an inorganic film included in the organic EL display device according to the first embodiment of the disclosure.
Figure 9:
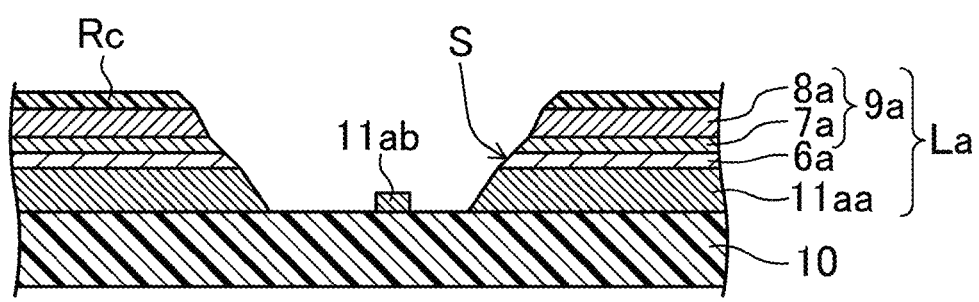
FIG. 9 is a cross-sectional view illustrating the third step for forming a residual layer of an inorganic film included in the organic EL display device according to the first embodiment of the disclosure.
Figure 10:
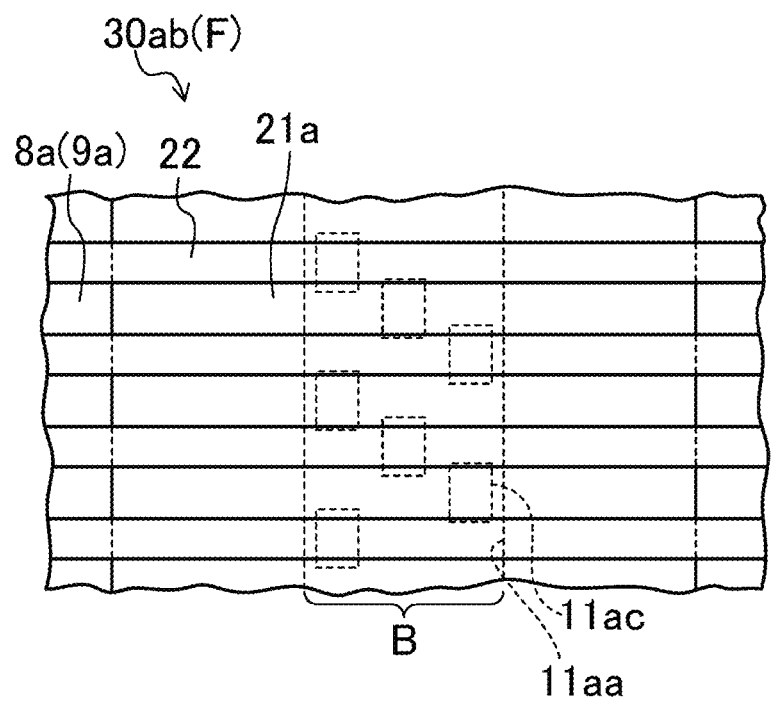
FIG. 10 is a plan view of a bending section of a frame region in the first modified example of the organic EL display device according to the first embodiment of the disclosure, where
Figure 11:
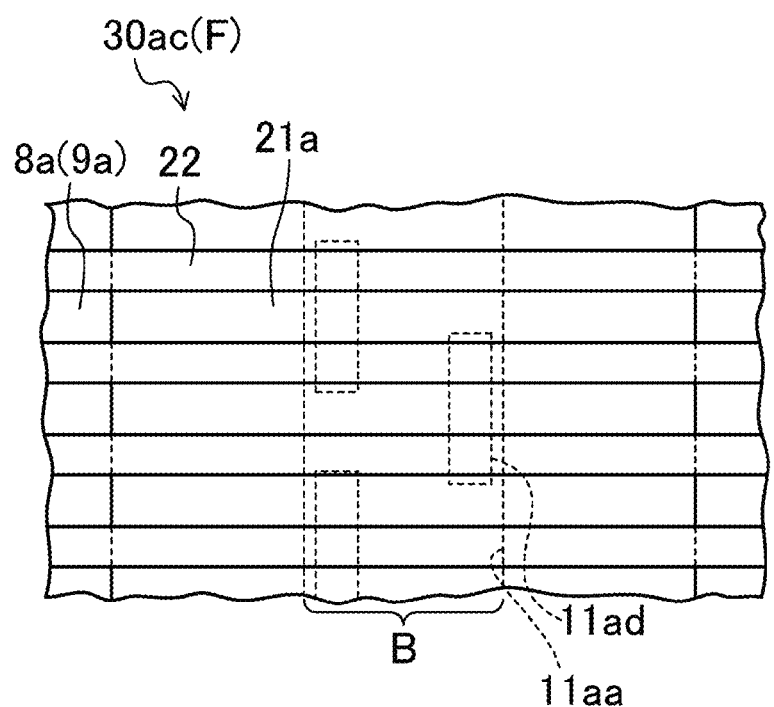
FIG. 11 is a plan view of a bending section of a frame region in the second modified example of the organic EL display device according to the first embodiment of the disclosure, where

FIG. 1 to FIG. 11 illustrate a first embodiment of a display device according to the disclosure. Note that, in each of the following embodiments, an example of an organic EL display device equipped with organic EL elements is given as a display device equipped with light-emitting elements. FIG. 1 is a plan view of an organic EL display device 30a according to the first embodiment. FIG. 2 is a cross-sectional view of the organic EL display device 30a taken along line II-II in FIG. 1. FIG. 3 is an equivalent circuit diagram of a TFT layer 29 included in the organic EL display device 30a. FIG. 4 is a cross-sectional view of an organic EL layer 16 included in the organic EL display device 30a. FIG. 5 is a plan view of a bending section B of a frame region F of the organic EL display device 30a. FIG. 6 is a cross-sectional view of the bending section B of the frame region F of the organic EL display device 30a taken along line VI-VI in FIG. 5. FIG. 7, FIG. 8, and FIG. 9 are cross-sectional views illustrating the first, second, and third steps for forming a residual layer 11ab of an inorganic film La included in the organic EL display device 30a. FIG. 10 and FIG. 11 are plan views of the bending section B of the frame region F in organic EL display devices 30ab and 30ac being the first and second modified example of the organic EL display device 30a, where FIG. 10 and FIG. 11 are views each corresponding to FIG. 5.

As illustrated in FIG. 1, the organic EL display device 30a includes a display region D defined in a rectangular shape for displaying an image, and the frame region F defined around the display region D. As illustrated in FIG. 2, the display region D of the organic EL display device 30a is provided with organic EL elements 19 and in the display region D, a plurality of pixels are arranged in a matrix pattern. Note that each of the pixels in the display region D includes, for example, a subpixel for display of red grayscale, a subpixel for display of green grayscale, and a subpixel for display of blue grayscale. These subpixels are disposed adjacent to one another. As illustrated in FIG. 1, a terminal section T is provided at the right end portion of the frame region F in the figure. As illustrated in FIG. 1, between the display region D and the terminal section T in the frame region F, the bending section B bendable at 180 degrees (in a U shape) with a bending axis being the vertical direction in the figure is provided to be along one side (right side in the figure) of the display region D.

As illustrated in FIG. 2, the organic EL display device 30a includes, in the display region D, a resin substrate layer 10, a TFT layer 29 provided on the front surface of the resin substrate layer 10, and an organic EL element 19 provided, as a light-emitting element, on the front surface of the TFT layer 29, a front surface side protection layer 25a provided on the front surface of the organic EL element 19 and a back surface side protection layer 25b provided on the back surface of the resin substrate layer 10.

The resin substrate layer 10, which is formed of, for example, a polyimide resin or the like with a thickness of approximately from 10 μm to 20 μm, is provided as a resin substrate.

As illustrated in FIG. 2, the TFT layer 29 includes a base coat film 11aa provided on the resin substrate layer 10, a plurality of first TFTs 12a (see FIG. 3) and a plurality of second TFTs 12b that are provided on the base coat film 11aa, and a flattening film 13 provided on the first TFTs 12a and the second TFTs 12b. As illustrated in FIG. 3, the TFT layer 29 is provided with a plurality of gate lines 26 provided to extend in parallel to one another in the horizontal direction in the figure. As illustrated in FIG. 3, the TFT layer 29 is also provided with a plurality of source lines 27a provided to extend in parallel to one another in the vertical direction in the figure. As illustrated in FIG. 3, the TFT layer 29 is further provided with a plurality of power supply lines 27b each provided juxtaposed to each source line 27a to extend in parallel to one another in the vertical direction in the figure. As illustrated in FIG. 3, the TFT layer 29 is further provided with, in each subpixel, the first TFT 12a, the second TFT 12b, and a capacitor 28.

The base coat film 11aa is formed with, for example, a single layer film or a multilayer film of an inorganic insulating film such as a silicon nitride film, a silicon oxide film, a silicon oxynitride film, or the like.

As illustrated in FIG. 3, the first TFT 12a is coupled to respective gate line 26 and source line 27a in each subpixel. As illustrated in FIG. 3, the second TFT 12b is coupled to respective first TFT 12a and power supply line 27b in each subpixel. The first TFT 12a and the second TFT 12b each include, for example, a semiconductor layer provided in an island shape on the base coat film 11aa, a gate insulating film 6a (see FIG. 6) provided to cover the semiconductor layer, a gate electrode provided to partially overlap with the semiconductor layer on the gate insulating film 6a, an interlayer insulating film 9a (see FIG. 6) provided to cover the gate electrode, and a source electrode and a drain electrode provided in a manner spaced apart from each other on the interlayer insulating film 9a. Note that, although in the first embodiment, the top-gate type is described as an example of the first TFT 12a and the second TFT 12b, the first TFT 12a and the second TFT 12b may be of the bottom-gate type.

As illustrated in FIG. 3, the capacitor 28 is coupled to the respective first TFT 12a and power supply line 27b in each subpixel. The capacitor 28 is formed with, for example, one electrode formed of the same material in the same layer as the gate electrode, the other electrode formed of the same material in the same layer as the source electrode and the drain electrode, and the interlayer insulating film 9a (see FIG. 6) provided between the pair of these electrodes.

The flattening film 13 is formed of, for example, a colorless and transparent organic resin material, such as a polyimide resin.

As illustrated in FIG. 2, the organic EL element 19 includes a plurality of first electrodes 14, an edge cover 15, a plurality of organic EL layers 16, a second electrode 17, and a sealing film 18, which are provided in the order stated, over the flattening film 13.

As illustrated in FIG. 2, the plurality of first electrodes 14 are provided, each corresponding to each subpixel, in a matrix pattern over the flattening film 13. As illustrated in FIG. 2, the first electrode 14 is coupled to the drain electrode of the TFT 12 via a contact hole formed through the flattening film 13. The first electrode 14 functions to inject holes into the organic EL layer 16. It is further preferable that the first electrodes 14 include a material having a large work function to improve the efficiency of hole injection into the organic EL layer 16. Examples of materials that may be included in the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the first electrode 14 include alloys, examples of which include magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Further examples of materials that may be included in the first electrode 14 include electrically conductive oxides, examples of which include tin oxide (SnO), zinc oxide (ZnO), indium tin oxide (ITO), and indium zinc oxide (IZO). The first electrode 14 may include a stack of two or more layers of any of the above-mentioned materials. Note that, examples of materials having a large work function include indium tin oxide (ITO) and indium zinc oxide (IZO).

As illustrated in FIG. 2, the edge cover 15 is provided in a lattice pattern and surrounds the outer perimeter portion of each first electrode 14. Examples of materials that may be included in the edge cover 15 include an inorganic film, for example, a silicon oxide ($SiO_2$) film, a silicon nitride (SiNx (x is a positive number)) film such as a trisilicon tetranitride ($Si_3N_4$) film, or a silicon oxynitride (SiON) film; and an organic film, for example, a polyimide resin film, an acrylic resin film, a polysiloxane resin film, or a novolak resin film.

As illustrated in FIG. 2, the plurality of organic EL layers 16 are provided in a matrix pattern, each being arranged on each of the first electrodes 14 and each corresponding to each subpixel. As illustrated in FIG. 4, the organic EL layers 16 each include a hole injection layer 1, a hole transport layer 2, a light-emitting layer 3, an electron transport layer 4, and an electron injection layer 5, which are provided in the order stated, over the first electrode 14.

The hole injection layer 1 is also referred to as an anode buffer layer, and functions to reduce the energy level difference between the first electrode 14 and the organic EL layer 16, to improve the efficiency of hole injection into the organic EL layer 16 from the first electrode 14. Examples of materials that may be included in the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 14 to the organic EL layer 16. Examples of materials that may be included in the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons recombine, when a voltage is applied via the first electrode 14 and the second electrode 17, the holes and electrons are injected from the first electrode 14 and the second electrode 17, respectively. The light-emitting layer 3 is formed of a material having high light-emitting efficiency. Examples of materials that may be included in the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate efficient migration of the electrons to the light-emitting layer 3. Examples of materials that may be included in the electron transport layer 4 include organic compounds, example of which include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron injection layer 5 functions to reduce the energy level difference between the second electrode 17 and the organic EL layer 16, to improve the efficiency of electron injection into the organic EL layer 16 from the second electrode 17. Because of this function, the driving voltage for the organic EL element 19 can be reduced. Note that the electron injection layer 5 is also referred to as a cathode buffer layer. Examples of materials that may be included in the electron injection layer 5 include inorganic alkaline compound such as lithium fluoride (LiF), magnesium fluoride ($MgF_2$), calcium fluoride ($CaF_2$), strontium fluoride ($SrF_2$), or barium fluoride ($BaF_2$); aluminum oxide ($Al_2O_3$); and strontium oxide (SrO).

As illustrated in FIG. 2, the second electrode 17 is disposed to cover the organic EL layers 16 and the edge cover 15. The second electrode 17 functions to inject electrons into the organic EL layer 16. It is further preferable that the second electrode 17 includes a material having a small work function to improve the efficiency of electron injection into the organic EL layer 16. Examples of materials that may be included in the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the second electrode 17 include alloys, examples of which include magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Further examples of materials that may be included in the second electrode 17 include electrically conductive oxides, examples of which include tin oxide (SnO), zinc oxide (ZnO), indium tin oxide (ITO), and indium zinc oxide (IZO). The second electrode 17 may include a stack of two or more layers of any of the above-mentioned materials. Note that, examples of materials having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 2, the sealing film 18 is provided to cover the second electrode 17, and functions to protect the organic EL layer 16 from moisture and oxygen. Examples of materials that may be included in the sealing film 18 include inorganic materials, example of which include silicon oxide ($SiO_2$), aluminum oxide ($Al_2O_3$), silicon nitride (SiNx (x is a positive number)) such as trisilicon tetranitride ($Si_3N_4$), and silicon carbon nitride (SiCN); and organic materials, example of which include acrylate, polyurea, parylene, polyimide, and polyamide.

The front surface side protection layer 25a and the back surface side protection layer 25b are each formed with, for example, a polyimide resin film or the like with a thickness of approximately 2 μm.

As illustrated in FIG. 5 and FIG. 6, the organic EL display device 30a includes, in the frame region F, the resin substrate layer 10, an inorganic layered film La and a frame flattening film 21a that are provided on the front surface of the resin substrate layer 10, a frame wiring line 22 provided on the front surfaces of the inorganic layered film La and the frame flattening film 21a, and the front surface side protection layer 25a provided to cover the frame wiring line 22. Note that, in the plan view of FIG. 5, the front surface side protection layer 25a on the frame wiring line 22 is omitted.

The inorganic layered film La, which is formed with at least one inorganic film included in the TFT layer 29, includes, as illustrated in FIG. 6, a base coat film 11aa, a gate insulating film 6a, and an interlayer insulating film 9a formed with a first interlayer insulating film 7a and a second interlayer insulating film 8a, which are layered in the order stated, over the resin substrate layer 10. As illustrated in FIG. 6, the base coat film 11aa, the gate insulating film 6a, and the interlayer insulating film 9a of the inorganic layered film La are not provided at the bending section B of the frame region F. Further, at the bending section B of the frame region F, as illustrated in FIG. 6, an opening portion S is formed on the front surface of the inorganic layered film La, in which a residual layer 11ab formed with at least one layer of the inorganic layered film La is provided, and the frame flattening film 21a is provided to cover the residual layer 11ab and to plug the opening portion S. Note that the back surface side protection layer 25b arranged in the display region D is also provided in the most part of the frame region F, but is not provided at the bending section B of the frame region F.

As illustrated in FIG. 5, the residual layer 11ab is arranged in a staggered manner in a plan view on the resin substrate layer 10, and is provided in island shapes. As illustrated in FIG. 5, the residual layer 11ab is provided greater than the line width of the frame wiring line 22 in a plan view to overlap with the frame wiring line 22. The residual layer 11ab may include residual layers 11ac and 11ad which are illustrated in FIG. 10 and FIG. 11. More specifically, as illustrated in FIG. 10, in the organic EL display device 30ab being the first modified example, each of the residual layers 11ac is provided to overlap with the frame wiring line 22 or the space formed between a pair of respective adjacent frame wiring lines 22. As illustrated in FIG. 11, in the organic EL display device 30ac being the second modified example, each of the residual layers 11ad is provided to intersect and overlap with the pair of respective adjacent frame wiring lines 22.

The frame flattening film 21a is formed with, for example, an organic insulating film such as a polyimide resin film with a thickness of approximately 2 μm.

The frame wiring line 22 is coupled to a signal wiring line (for example, gate line, source line, and power supply line) of the organic EL element 19 in the display region D. The frame wiring line 22 is formed with, for example, a metal layered film of a titanium film (with a thickness of approximately 200 nm)/an aluminum film (with a thickness of approximately 100 nm)/a titanium film (with a thickness of approximately 200 nm). Note that, although in the first embodiment, the example of the frame wiring line 22 formed with a metal layered film is given, the frame wiring line 22 may also be formed with a metal single layer film.

The organic EL display device 30a described above has flexibility, and is configured, in each subpixel, such that the light-emitting layer 3 of the organic EL layer 16 is caused to appropriately emit light via the first TFT 12a and the second TFT 12b so that images are displayed.

The organic EL display device 30a of the first embodiment can be manufactured as described below.

For example, the organic EL display device 30a can be manufactured in such a way that a base coat film 11aa and an organic EL element 19 are formed, using a well-known method, on the front surface of a resin substrate layer 10 formed on a glass substrate, a front surface side protection layer 25a is applied to the organic EL element 19 via an adhesive layer, and then a back surface side protection layer 25b is applied to the back surface of the resin substrate layer 10, from which the glass substrate has been peeled off, via an adhesive layer. The frame wiring line 22 of the frame region F is formed when the source electrode and the drain electrode of the TFT 12 that are included in the organic EL element 19 are formed. The frame flattening film 21a in the frame region F is formed, before the formation of the source electrode and the drain electrode of the TFT 12 that are included in the organic EL element 19, by forming and patterning a photosensitive organic insulating film such as a polyimide resin film in the frame region F alone. Note that the residual layer 11ab to be arranged at the bending section B of the frame region F is formed, for example, as described below.

As illustrated in FIG. 7, first, a resist Ra is formed, using a halftone mask, on the layered film of an inorganic insulating film 11, the inorganic insulating film 6, an inorganic insulating film 7, and an inorganic insulating film 8, which are formed over the resin substrate layer 10. The inorganic insulating film 11 is formed with, for example, a layered film of a silicon oxide film (upper layer)/a silicon nitride film (middle layer)/a silicon oxide film (lower layer), or the like. The inorganic insulating film 6 is formed with, for example, a single layer film such as a silicon nitride film. The inorganic insulating film 7 is formed with, for example, a single layer film such as a silicon nitride film. The inorganic insulating film 8 is formed with, for example, a layered film of a silicon nitride film (upper layer)/a silicon oxide film (lower layer). Note that, as illustrated in FIG. 7, the resist Ra is formed relatively thick in a portion corresponding to the base coat film 11aa, and is formed relatively thin in a portion corresponding to the residual layer 11ab.

Subsequently, the inorganic insulating films 11, 6, 7, and 8 exposed from the resist Ra are removed by dry etching, then, the inorganic insulating films 11, 6, 7, and 8 exposed from the resist Rb, which is formed by thinning the resist Ra by ashing, and, as illustrated in FIG. 8, an inorganic insulating film 11a, the gate insulating film 6a, the first interlayer insulating film 7a, and the second interlayer insulating film 8a are formed. The resist Rb is then thinned by dry etching to form a resist Rc.

Further, as illustrated in FIG. 9, the inorganic insulating film 11a exposed from the resist Rc is removed by dry etching to form the base coat film 11aa and the residual layer 11ab, and then the resist Rc is removed. The residual layer 11ab is formed in a thickness of approximately 300 nm with a silicon oxide film under the inorganic insulating film 11.

As described above, according to the organic EL display device 30a of the first embodiment, at the bending section B of the frame region F, the opening portion S is formed on the inorganic layered film La of the base coat film 11aa, the gate insulating film 6a, and the interlayer insulating film 9a that are layered in the order stated, in which the residual layer 11ab formed with at least one layer of the inorganic layered film La is provided. Then, since the front surface of the resin substrate layer 10 exposed from the base coat film 11aa is partially covered with the residual layer 11ab, the residue due to the resin substrate layer 10, which is generated by dry etching when the inorganic layered film La is formed, can be reduced. Accordingly, the residue due to the resin substrate layer 10 is hardly remained between the resin substrate layer 10 and the frame flattening film 21a provided to cover the residual layer 11ab on the resin substrate layer 10 and to plug the opening portion S of the inorganic layered film La, thus enhancing the adhesion between the resin substrate layer 10 and the frame flattening film 21a. This thus enhances the adhesion between the resin substrate layer 10 and the frame flattening film 21a at the bending section B of the frame region F.

In addition, the organic EL display device 30a of the first embodiment, in which the inorganic layered film La resides only as the residual layer 11ab having island shape at the bending section B of the frame region F, suppresses film breaking of the inorganic layered film La at the bending section B.

Second Embodiment

Figure 12:
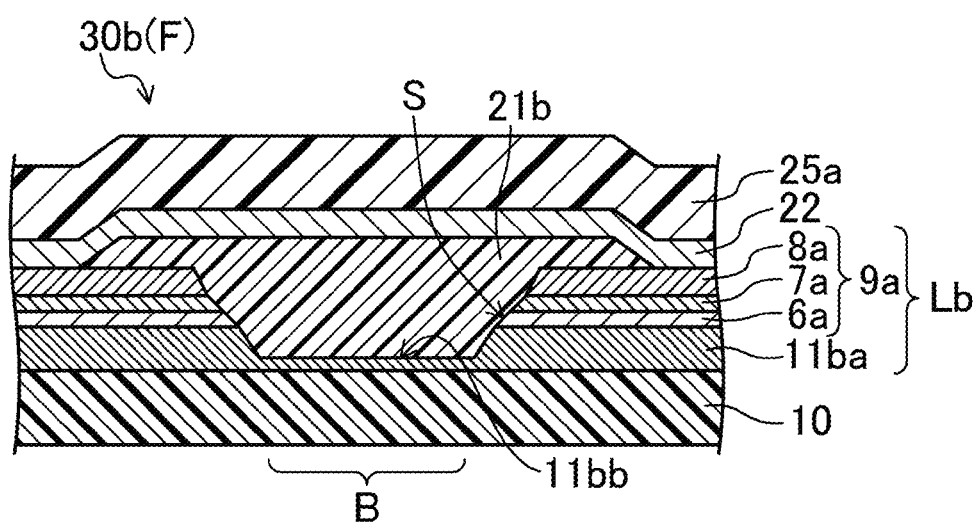
FIG. 12 is a cross-sectional view of a bending section of a frame region of the organic EL display device according to the first embodiment of the disclosure, where

FIG. 12 illustrates a second embodiment of the display device according to the disclosure. FIG. 12 is a cross-sectional view of a bending section B of a frame region F of an organic EL display device 30b of the second embodiment. Note that, in the following embodiment, portions identical to those in FIG. 1 to FIG. 11 are denoted by the same reference signs, and their detailed descriptions are omitted.

Although in the first embodiment, the example of the organic EL display device 30a in which the residual layer 11ab is provided in an island shape is given, an example of an organic EL display device 30b in which a residual layer 11bb is provided to cover the resin substrate layer 10 is given in the second embodiment.

The organic EL display device 30b, like the organic EL display device 30a of the first embodiment, includes a display region D for displaying an image, defined in a rectangular shape, and the frame region F including a terminal section T, defined around the display region D.

The display region D of the organic EL display device 30b has the same configuration as the organic EL display device 30a of the first embodiment.

As illustrated in FIG. 12, the organic EL display device 30b includes, in the frame region F, the resin substrate layer 10, an inorganic layered film Lb provided on the front surface of the resin substrate layer 10, and a frame flattening film 21b provided to cover a concave portion of the inorganic layered film Lb, a frame wiring line 22 provided on the front surfaces of the inorganic layered film Lb and the frame flattening film 21b, and a front surface side protection layer 25a provided to cover the frame wiring line 22. Note that the back surface side protection layer 25b arranged in the display region D is also provided in the most part of the frame region F, but is not provided at the bending section B of the frame region F.

The inorganic layered film Lb, which is formed with at least one inorganic film included in the TFT layer 29, includes, as illustrated in FIG. 12, a base coat film 11ba, a gate insulating film 6a, and an interlayer insulating film 9a formed with a first interlayer insulating film 7a and a second interlayer insulating film 8a, which are layered in the order stated, over the resin substrate layer 10. As illustrated in FIG. 12, the gate insulating film 6a and the interlayer insulating film 9a of the inorganic layered film La are not provided at the bending section B of the frame region F. Further, at the bending section B of the frame region F, as illustrated in FIG. 12, an opening portion S is formed on the front surface of the inorganic layered film Lb, in which a residual layer 11bb formed with at least one layer of the inorganic layered film Lb is provided, and the frame flattening film 21b is provided to cover the residual layer 11bb and to plug the opening portion S. Note that the residual layer 11bb is provided to cover the resin substrate layer 10 with, for example, the silicon oxide film (with a thickness of approximately 300 nm) as the lower layer in the inorganic insulating film 11 described in the first embodiment.

The frame flattening film 21b is formed with, for example, an organic insulating film such as a polyimide resin film with a thickness of approximately 2 µm.

The organic EL display device 30b described above has flexibility as in the organic EL display device 30a of the first embodiment, and is configured, in each subpixel, such that the light-emitting layer 3 of the organic EL layer 16 is caused to appropriately emit light via the first TFT 12a and the second TFT 12b so that images are displayed.

The organic EL display device 30b of the second embodiment can be manufactured, by modifying the pattern shapes of the base coat film 11aa and the residual layer 11ab, in the method for manufacturing the organic EL display device 30a of the first embodiment.

As described above, according to the organic EL display device 30b of the second embodiment, at the bending section B of the frame region F, the opening portion S is formed on the inorganic layered film Lb of the base coat film 11ba, the gate insulating film 6a, and the interlayer insulating film 9a that are layered in the order stated, in which the residual layer 11bb formed with at least one layer of the inorganic layered film Lb is provided. Then, since the front surface of the resin substrate layer 10 exposed from the base coat film 11ba is covered with the residual layer 11bb, the residue due to the resin substrate layer 10, which is generated by dry etching when the inorganic layered film Lb is formed, can be reduced. Accordingly, the residue due to the resin substrate layer 10 is drastically reduced between the resin substrate layer 10 and the frame flattening film 21b provided to cover the residual layer 11bb on the resin substrate layer 10 and to plug the opening portion S of the inorganic layered film La, thus enhancing the adhesion between the resin substrate layer 10 and the frame flattening film 21b. This thus enhances the adhesion between the resin substrate layer 10 and the frame flattening film 21b at the bending section B of the frame region F.

In addition, the organic EL display device 30b of the second embodiment, in which the inorganic layered film Lb resides only as the residual layer 11bb with a thin thickness at the bending section B of the frame region F, suppresses film breaking of the inorganic layered film Lb at the bending section B.

Other Embodiments

Note that, although in the above-described embodiments, the example of the organic EL display device as a display device is given, the disclosure is applicable to a display device equipped with a plurality of light-emitting elements which are driven by a current, for example, a display device equipped with quantum dot light-emitting diodes (QLEDs), which are light-emitting elements using quantum dot-containing layer.

Although in the above-described embodiments, the example of the frame wiring line 22 of a single line is given, the frame wiring line 22 may be made redundant by double lines extending in parallel with each other.

Although in the above-described embodiments, the example of the residual layers 11ab and 11bb each formed with the silicon oxide film as the lower layer in the inorganic insulating film 11 is given, the residual layers 11ab and 11bb may be each formed with, for example, a layered film of the silicon oxide film as the lower layer and the silicon nitride film as the intermediate layer in the inorganic insulating film 11, or a layered film of the silicon oxide film as the lower layer, the silicon nitride film as the intermediate layer, and the silicon oxide film as the upper layer in the inorganic insulating film 11. Further, the residual layers 11ab and 11bb may be each formed with, for example, a layered film of the inorganic insulating film 11 to be the base coat film 11aa and the inorganic insulating film 6 to be the gate insulating film 6a.

In the above-described embodiments, the example of the organic EL layer including the five-layer structure including the hole injection layer, the hole transport layer, the light-emitting layer, the electron transport layer, and the electron injection layer is given. It is also possible that, for example, the organic EL layer may include a three-layer structure including a hole injection-cum-transport layer, a light-emitting layer, and an electron transport-cum-injection layer.

In the above-described embodiments, the example of the organic EL display device including the first electrode as an anode and the second electrode as a cathode is given. However, the disclosure is also applicable to an organic EL display device, in which the layers of the structure of the organic EL layer are in the reverse order, with the first electrode being a cathode and the second electrode being an anode.

In the above-described embodiments, the example of the organic EL display device in which the electrode of the TFT coupled to the first electrode serves as the drain electrode is given. However, the disclosure is also applicable to an organic EL display device in which the electrode of the TFT coupled to the first electrode is referred to as the source electrode.

INDUSTRIAL APPLICABILITY

As described above, the disclosure is useful for display devices having flexibility.

REFERENCE SIGNS LIST

B Bending section
D Display region
F Frame region
La, Lb Inorganic layered film (at least one layer of inorganic film)
S Opening portion
T Terminal section
6a Gate insulating film
9a Interlayer insulating film
10 Resin substrate layer (resin substrate)
11aa Base coat film
11ab, 11bb Residual layer
19 Organic EL element (light-emitting element)
21a, 21b Frame flattening film
22 Frame wiring line
29 TFT layer
30a, 30b Organic EL display device

The invention claimed is:

1. A display device comprising:
a resin substrate;
a light-emitting element included in a display region, the light-emitting element being provided above the resin substrate with a TFT layer in between;
a frame region provided around the display region;
a terminal section provided at an end portion of the frame region;
a bending section provided between the display region and the terminal section;
a frame wiring line provided in the frame region, the frame wiring line extending to the terminal section while being coupled to the light-emitting element; and
an at least one layer of inorganic film provided in the frame region, the at least one layer of inorganic film being included in the TFT layer overlaid on the resin substrate, wherein
at the bending section, an opening portion is defined on the at least one layer of inorganic film,
in the opening portion, a residual layer of the at least one inorganic film is defined,
the frame wiring line is provided on a flattening film being provided to plug the opening portion,
the residual layer is provided as a plurality of residual layers each having an island shape, and
the residual layer is thicker than a line width of the frame wiring line in a plan view.

2. The display device according to claim 1 wherein the residual layer is provided to intersect the plurality of frame wiring lines.

3. The display device according to claim 1 wherein the residual layer is provided in a staggered manner in the plan view.

4. The display device according to claim 1, wherein the residual layer is provided to cover the resin substrate.

5. The display device according to claim 1, wherein the residual layer is defined with a portion of a base coat film provided on the resin substrate.

6. The display device according to claim 5, wherein
the base coat film is provided by layering a plurality of inorganic insulating films, and
the residual layer is defined with an inorganic insulating film as a lowermost layer among the plurality of inorganic insulating films.

7. The display device according to claim 1, wherein the light-emitting element includes an organic EL element.

8. The display device according to claim 1, wherein the resin substrate and the flattening film are each made of polyimide resin.

9. A display device comprising:
a resin substrate;
a light-emitting element included in a display region, the light-emitting element being provided above the resin substrate with a TFT layer in between;

a frame region provided around the display region;

a terminal section provided at an end portion of the frame region;

a bending section provided between the display region and the terminal section;

a frame wiring line provided in the frame region, the frame wiring line extending to the terminal section while being coupled to the light-emitting element; and an at least one layer of inorganic film provided in the frame region, the at least one layer of inorganic film being included in the TFT layer overlaid on the resin substrate; wherein at the bending section, an opening portion is defined on the at least one layer of inorganic film;

in the opening portion, a residual layer of the at least one inorganic film is defined;

the frame wiring line is provided on a flattening film being provided to plug the opening portion; and the residual layer is not a metal.

10. The display device according to claim 9, wherein the residual layer is provided as a plurality of residual layers each having an island shape.

11. The display device according to claim 10, wherein the residual layer is thicker than a line width of the frame wiring line in a plan' view.

12. The display device according to claim 11, wherein the residual layer is provided to intersect the plurality of frame wiring lines.

13. The display device according to claim 10, wherein the residual layer is provided in a staggered manner in a plan view.

14. The display device according to claim 9, wherein the residual layer is provided to cover the resin substrate.

15. The display device according to claim 9, wherein the residual layer is defined with a portion of a base coat film provided on the resin substrate.

16. The display device according to claim 15, wherein the base coat film is provided by layering a plurality of inorganic insulating films; and the residual layer is defined with an inorganic insulating film as a lowermost layer among the plurality of inorganic insulating films.

17. The display device according to claim 9, wherein the light-emitting element includes an organic EL element.

18. The display device according to claim 9, wherein the resin substrate and the flattening film are each made of polyimide resin.

19. A display device comprising:

a resin substrate;

a light-emitting element included in a display region, the light-emitting element being provided above the resin substrate with a TFT layer in between;

a frame region provided around the display region;

a terminal section provided at an end portion of the frame region;

a bending section provided between the display region and the terminal section;

a frame wiring line provided in the frame region, the frame wiring line extending to the terminal section while being coupled to the light-emitting element; and an at least one layer of inorganic film provided in the frame region, the at least one layer of inorganic film being included in the TFT layer overlaid on the resin substrate; wherein at the bending section, an opening portion is defined on the at least one layer of inorganic film;

in the opening portion, a residual layer of the at least one inorganic film is defined;

the frame wiring line is provided on a flattening film being provided to plug the opening portion; and the residual layer is defined from a lowermost layer of the at least one inorganic film.

20. The display device according to claim 19, wherein the residual layer is provided as a plurality of residual layers each having an island shape.

* * * * *